United States Patent [19]

Abbiate

[11] Patent Number: 4,523,322
[45] Date of Patent: Jun. 11, 1985

[54] INTERFACE DEVICE FOR MODEMS

[75] Inventor: Jean-Claude Abbiate, La Gaude, France

[73] Assignee: International Business Machines Corporation, Armonk, N.Y.

[21] Appl. No.: 452,565

[22] Filed: Dec. 23, 1982

[30] Foreign Application Priority Data

Dec. 29, 1981 [EP] 12291981 .................. 81430044.8

[51] Int. Cl.³ ............................................. H04L 7/02
[52] U.S. Cl. ........................................ 375/36; 375/81; 375/120
[58] Field of Search ...................... 375/37, 80, 81, 106, 375/107, 108, 111, 36, 120; 370/80, 100, 103; 331/1 A; 179/2 DP, 2 C; 328/63, 72

[56] References Cited

U.S. PATENT DOCUMENTS

| 3,778,549 | 12/1973 | Schröder et al. | 178/68 |
| 3,940,558 | 2/1976 | Gabbard et al. | 370/103 |
| 4,229,816 | 10/1980 | Breidenstein et al. | 375/107 |
| 4,253,181 | 2/1981 | Watten | 375/107 |
| 4,270,211 | 5/1981 | Schichte | 375/107 |
| 4,309,662 | 1/1982 | Baudoux | 328/73 |

FOREIGN PATENT DOCUMENTS 0015014 9/1980 European Pat. Off. .

OTHER PUBLICATIONS

Davies D. W. et al., "Communications Networks for Computers", Wiley, 1973, pp. 167–168.
G. Epenoy et al., "Elastic Buffer with Automatic Shift Correction Capability", IBM Tech. Disclosure Bulletin, vol. 22, No. 10, Mar. 1980, pp. 4597–4599.

Primary Examiner—Robert L. Griffin
Assistant Examiner—Stephen Chin
Attorney, Agent, or Firm—Edward H. Duffield

[57] ABSTRACT

An interface device for synchronizing an internally clocked modem and data terminal equipment (DTE) provided with their own clock circuits, each of said own terminal clock circuit providing an external clock signal (RC Ext). The interface includes a PLO generating a recovered clock signal (XCO). At a moment defined by a request to send signal the phases of XCO and RC Ext are compared with each other and a switched clock signal SWC oscillating at a fast rate for a time interval corresponding to the phase delay between RC Ext and XCO and subsequently oscillating at a slow rate, is generated. The signal SWC is used for shifting RC Ext and terminal provided data RD Ext into shift registers respectively. The shifted RC Ext is used for controlling the adjustment of the interface PLO.

5 Claims, 11 Drawing Figures

INTERFACE DEVICE FOR MODEMS

TECHNICAL FIELD

This invention relates to digital data transmission systems and more particularly, to a device for synchronizing a modem with external clocks.

BACKGROUND OF THE INVENTION

In digital data transmission systems, sequences of bits are exchanged between terminals through a transmission channel after having usually been submitted to a so-called "modulation" operation at the input terminal, and to a so-called "demodulation" operation at the output terminal. In fact, the bits or groups of bits converted into symbols, are transmitted or "emitted" one by one, at so-called "signalling instants" which are evenly separated and defined by a transmit clock. Consequently, the transmitted wave represents data only on said signalling instants which must be accurately defined. The transmit clock is often comprised of an oscillator of the so-called "digital phase locked" type (PLO). The PLO includes a crystal oscillator which is, therefore, accurate and stable, and operates at a frequency substantially exceeding the desired clock frequency. The crystal oscillator wave goes through frequency divider stages the output of which provides a signal having the adequate clock frequency. The clock signal phase is adjusted by controlling the dividing factors of the divider stages.

Thus, the emitter or transmitter can, to a certain extent, synchronize the internal operations performed to fetch out and process the bits to be emitted which are provided by a terminal at the operating rate of said terminal. In certain cases, the actuation of the PLO does not allow the synchronization problems to be properly solved. More particularly, this is the case when the phase of the clock signal defining the data bit rate, varies too briskly. Then, other means are used like those described in the IBM Technical Disclosure Bulletin, Vol. 22, No. 10, March 1980, pages 4597-4599. The rate at which the data are provided by a terminal and the rate at which the emitter fetches them out, are matched by using so-called "elastic" buffers. In addition to the fact that additional equipment is required to ensure the above indicated buffer function, the elasticity of the registers is limited by their size and by the differences between their loading and unloading rates. It is easy to understand that under certain operating conditions, some bits can be lost, which therefore, leads to transmission errors.

Also, in up-to-date transmission systems, a single transmitter or "emitter" is connected to service data from several terminals. Although the terminals individually connected to the system are exclusively actuated one by one, the transmitter clock must be able to quickly adjust itself to any one of the terminal clock phases and frequencies to enable proper operation of the system. In certain instances, the clock of the terminal to be connected may be in opposite phase and/or at a frequency different from the one of the presently connected terminal. The emitter clock should be able to be switched from one frequency to another and, more particularly, from one phase to another. This switching should be quickly carried out to avoid losing any data.

OBJECT OF THE INVENTION

An object of this invention is to provide an improved interface circuit ensuring a quick compensation of the phase delay between an emitter clock (internal clock) and a terminal clock (external clock) provided by a terminal to be served by said emitter while preventing data (bits) from being lost.

BRIEF SUMMARY OF THE INVENTION

To meet the foregoing object and others not specifically enumerated, the data emitting system is provided with an interface having clock and data buffering circuits. Said buffering circuits comprise a phase locked clock provided for generating a recovered clock signal with which the emitter clock is to be synchronized. Said phase locked clock is controlled by a reference signal provided by a clock shift register which is loaded with said external clock signal. The content of said clock shift register is shifted at the rate of a so-called switched clock signal. The switched clock signal is generated by comparing the phase of the recovered clock signal with the phase of the external clock and by generating, starting at an initial time reference, a first signal oscillating at a given fast frequency for a fraction of the first external clock cycle following said initial time. This fraction corresponds to the phase delay between the recovered clock and external clock signals. Subsequently, a second signal oscillating at a low frequency is generated. The switched clock signal is also used to control a data shift register loaded with the data signal to be transmitted. The initial time reference is defined based on a request to send signal switching from one binary level to the other.

DETAILED SPECIFICATION

Figure 1:
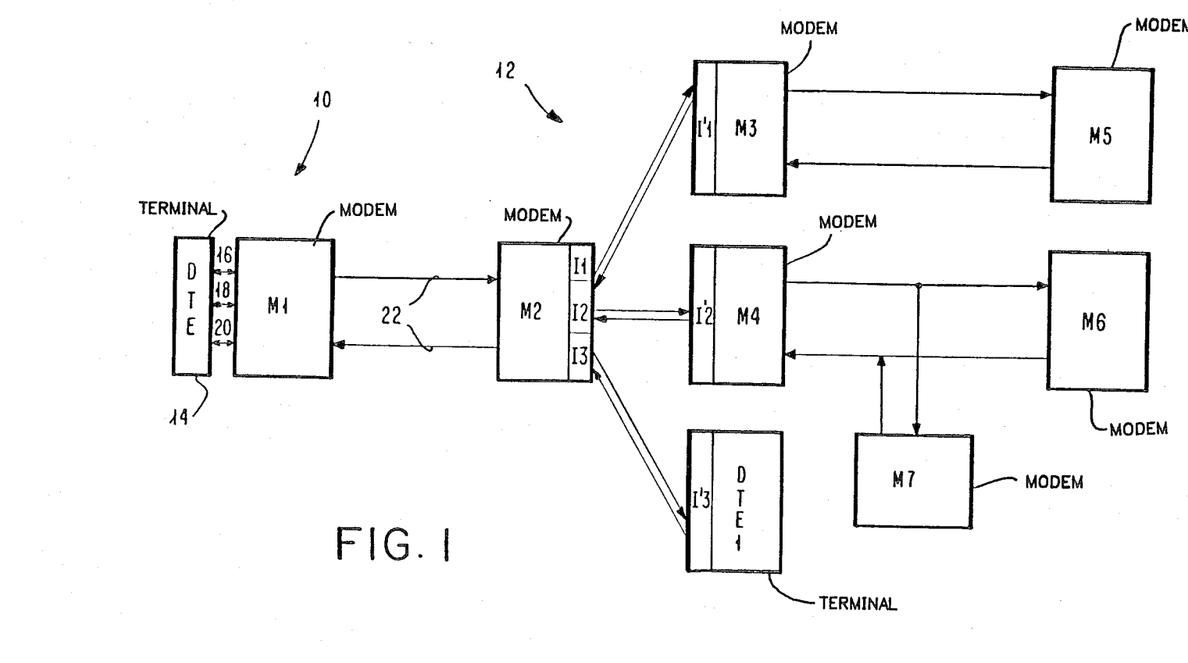
FIG. 1 illustrates a transmission network.

Represented in FIG. 1 is an example of a digital transmission system. A local network 10 is provided at one end of the system. Network 10 comprises a terminal 14 (DTE) connected to a modem (Modulator/Demodulator) M1. The modem M1 is made for emitting or transmitting data provided by terminal 14 and for receiving data from the line 22 and providing said received data to the terminal 14. The data exchanges between terminal 24 and modem M1 are carried out through channels 16, 18, 20. A remote network 12 is provided at the other end of the system. The network 12 comprises a modem M2 connected to modem M1 through the bidirectional transmission channel 22. In addition, modem M2 is connected through interfaces I1 and I2 to tributary modems M3 and M4 which serve other modems M5, M6, M7 connected to other terminals (not shown). Modems M1 to M7 can be any of most commonly available modems such as the IBM modems of the 3863 or 3864 or 3865 type. In addition, modem M2 serves a terminal (DTE1) through interface circuit I3.

As shown in FIG. 1, modem M2 serves several terminals (or modems). Therefore, the above indicated problem which is due to the presence of multiple inputs to a modem appears most severely at the level of modem M2. Although the figure shows a network in which the number of the elements which are directly served by modem M2 is limited to 3, namely terminal DTE1 and modems M3 and M4, it should be noted that this number (3) and the composition of said elements are not restrictive. In addition, for the invention, the difference between modems M3, M4 and terminals DTE1 has no importance. They can all be considered as terminals connected to modem M2.

Figure 2:
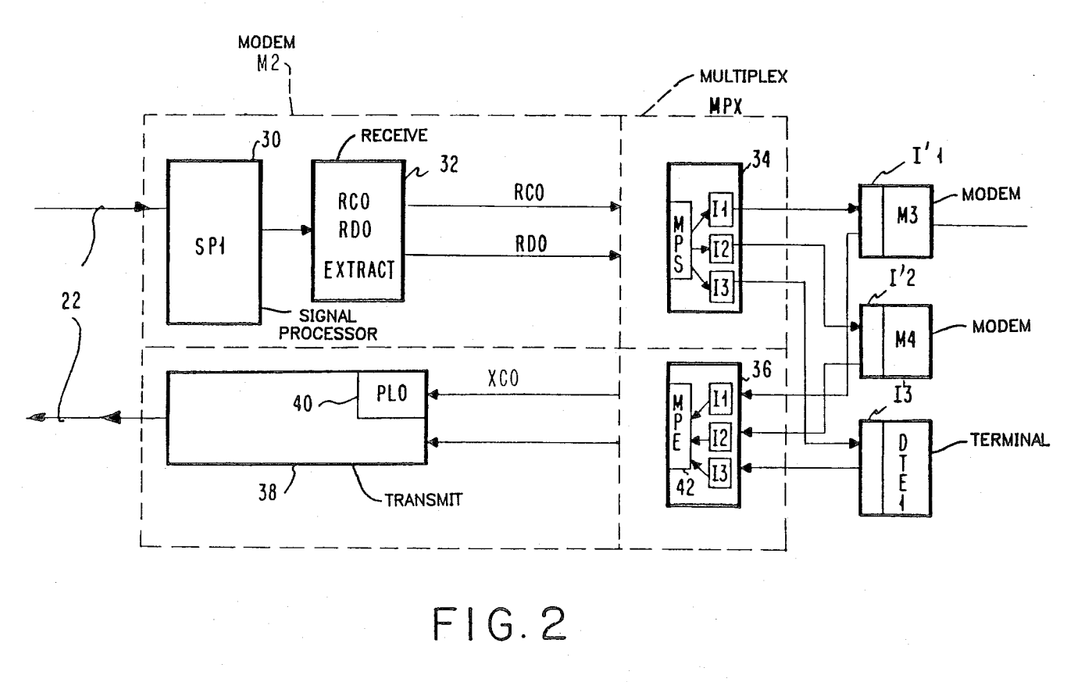
FIG. 2 is a detailed illustration of a portion of the network shown in FIG. 1.

FIG. 2 is a more detailed view of modem M2 and provides a better description of the invention. First of all, it should be noted that the modem is divided into two portions, namely the upper portion representing the receive devices and the lower portion representing the emit devices. Functionally, the receiver comprises three blocks 30, 32 and 34. Block 30 (SP1) performs a signal processing function on the signal received through line 22. Block 32 derives receive clock (RCO) and receive data (RDO) signals from the signal processed by SP1. Then, block 34 dispatches the data RDO towards their respective destination, namely modems M3, M4 or terminal DTE1, through fan-out device MPS and interface circuits I1, I2 or I3. MPS and interface circuits I1, I2, I3 are parts of a multiplexing/demultiplexing device MPX.

Detailed information relating to the means provided for processing the received signal and, to the means provided for deriving the receive clock signal (RCO) therefrom could be more particularly found in copending U.S. patent application Ser. No. 156,140, filed on June 3, 1980. Briefly stated, the receive clock signal (RCO) is produced in the receiver by using a PLO controlled by information derived from the received signal and processed in SP1. The same clock also controls the fetching of the data (RDO) out of the received signal. The appropriate orientation of the received information (data bits) towards to appropriate interface, is ensured by the use of an address information within the received data. On the receive end, the synchronization of the various operations to be carried out, is under the control of the received clock signal (RCO). Therefore, as far as this synchronization is concerned, there is no particular problem to be solved in order to avoid clock mismatches. Such is not the case on the emission side.

The lower portion of FIG. 2 has been shown to emphasize the distribution of the major emit functions and to enable locating the invention within its context. Modems M3 and M4 and terminal DTE1 are respectively connected to interfaces I1, I2 and I3 of a device 36 orientating the data to be transmitted towards emitter 38. Emitter 38 may be of the type used in the IBM 3863 to 3865 modems and operates in the so-called "double side band-quadrature carrier" technique (DSB-QC).

The data bits provided by terminal DTE1 and modems M3 and M4 are grouped according to predetermined rules. For instance, emitter 38 forms groups of four bits (quadbits). Each quadbit defines a data symbol $a_i$, which is, in turn, converted into information relating to the phases and/or amplitudes of the carriers to be transmitted. Obviously, all these operations must be synchronized one with respect to the others. To ensure this synchronization, the emitter is provided with an oscillator 40 or clock of the PLO type. But terminal DTE1 and modems M3 and M4 provide data bits at their own rate, to interfaces I1, I2 and I3. In this case, modem M2 is said to operate with respect to external clocks. In order to allow the emission to be correctly performed, the bits are to be fetched out of interfaces I1 through I3 at the right times. Therefore, a phase and frequency synchronization must be ensured between PLO 40 and the external clocks while preventing data from being lost. The phase synchronization problem will more particularly be addressed here.

In the present case, this synchronization is ensured by an input interface multiplexer or Fan-In device (MPE) 42. This device acts as a buffer between the clocks of the external sources of data to be transmitted and PLO 40 so as to neutralize any effect due to the phase delays between said external clocks and PLO 40. The fan-in device 42 will provide the PLO 40 with a recovered clock signal XCO whichever the terminal in function may be. It is to be noted that only one external source provides data bits at a time. In other words, when a source provides a bit, the other sources are on stand-by. To improve this exclusive provision of bits by only one source at a time, interfaces I1, I2, I3 are connected to an excluding circuit to be described later.

Figure 3A:
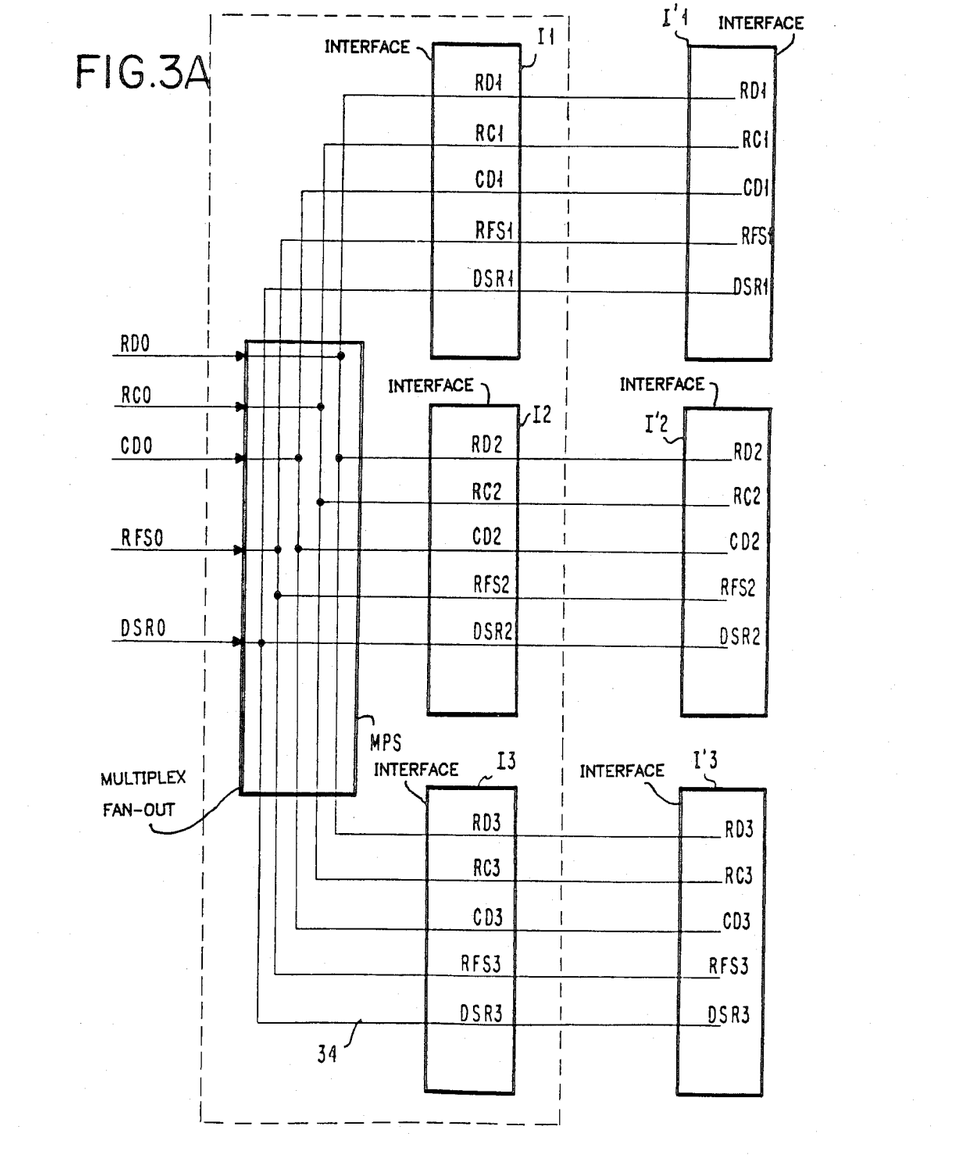
FIGS. 3A and 3B are detailed illustrations of portions of the interfaces of circuits 34 and 36 shown in FIG. 2.
Figure 3B:
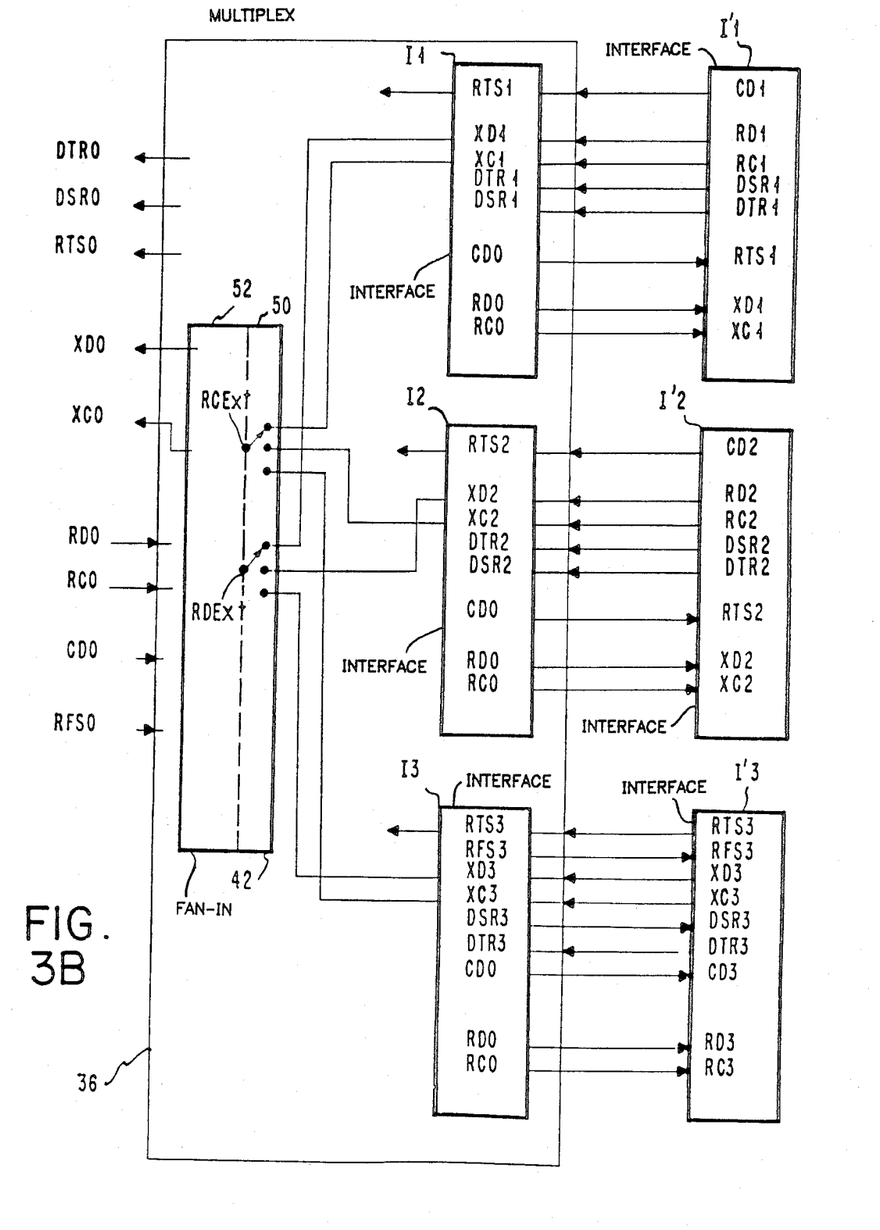

FIGS. 3A and 3B are detailed illustrations of interface circuits I1, I2, I3 as well as of their corresponding circuits I'1, I'2 and I'3 which are respectively located in modems M3, M4 and terminal DTE1. All these interfaces are designed in accordance with the CCITT requirements and more particularly, with its recommendation V24. This recommendation defines connecting circuits numbered in the "100" series from 102 to 192. More particularly:

Circuit 103 V24: Transmit Data (XD): The data signal received by modem M2 and to be transmitted by said modem M2 go through this circuit.

Circuit 104 V24: Receive Data (RD): The data signals provided by modem M2 go through this circuit.

Circuit 105 V24: Request to Send (RTS): The signals on this circuit control modem M2 to set into transmit condition. Depending upon the logic level of this circuit, the modem is set to transmit condition on the data channel, or on the contrary, no transmit condition.

Circuit 106 V24: Ready for Sending (RFS): The signals on this circuit indicate whether modem M2 is ready to operate or not. One of the logic conditions of this circuit indicates that the modem is connected to the transmission line and that it is ready to exchange other control signals with the device (M2, M3 or DTE1) in order in initiate the data exchange.

Circuit 108/2 V24: Data Terminal Ready (DTR): The signals on this circuit control switching of modem M2 in order to connect it to the line or to disconnect it. The terminal (or tributary modem) can present a given logic level onto circuit 108/2 each time it is ready to emit or receive data.

Circuit 109 V24: Data Channel Received Line Signal Detector: Also called "carrier detection" (CD).

Circuit 113 V24: Transmitter Signal Element Timing (XC): The signals on this circuit provide to the modem, the time base (external clock) for the signal elements.

NOTE: It is the external clock whose synchronization is to be ensured as accurately as possible with clock (PLO) 40 (or conversely).

Circuit 115 V24: Receiver Signal Element Timing (RC).

The abbreviations for the above-described circuits are shown on FIGS. 3A and 3B and are provided with an index defined in accordance with their location. Index "0" is used for modem M2. Index "1" for interfaces I1 and I'1, index "2" for interfaces I2 and I'2, index "3" for interfaces I3 and I'3. The circuits themselves are well known from the CCITT reference.

FIG. 3A illustrates the connections at the receive end of modem M2, (the upper portion of FIG. 2). It appears that the fan-out device MPS is reduced to its simplest expression. Its purpose is to connect circuits RDO (104), RCO (115), CDO (109), RFSO (106) and DSRO (107) directly to interfaces (I1, I'1) (I2, I'2) and (I3, I'3). Therefore, MPS applies the time base signal RCO (clock) extracted from the data by device 32, to the interfaces and from there, to modems M3, M4 and to terminal DTE1. The device MPS also dispatches the received data RDO to the group of interfaces. The identification of the specific terminal to be really provided with the data, will be performed by said terminal identifying itself from an address information within the received data.

FIG. 3B illustrates the circuits interconnecting the interfaces with the transmit portion of modem M2. It should be remembered that for the sake of the invention, modems M3 and M4 can be considered as terminals. As indicated above, the interconnections are more difficult to be established in this case. The input interface multiplexer (fan-in) device MPE is more sophisticated than the device MPS since it is necessary to synchronize the extractions of the data to be emitted, i.e., to ensure more particularly the reciprocal synchronizations of the clock signals in use, namely the so-called "external" clocks of modems M3, M4 and terminal DTE1 and to provide a single signal as stable as possible to clock 40 for an easy synchronization thereof.

As soon as one of the interfaces I1, I2 or I3 is functioning, it is necessary to exclude the two other ones. This is ensured by an excluding circuit 50. This excluding circuit provides external clock (RC Ext) and data (RD Ext) information which are in fact, the clock and data signals provided by the interface I1, I2 or I3 to be served by emitter 38 after the exclusion of the two other interfaces. A data and clock buffering device 52 connecting the excluding circuit 50 to emitter 38, ensures the appropriate phasing of the data (DXO) provided to emitter 38 and provides a recovered clock information (XCO). Information XCO is provided to ensure an appropriate time synchronization of the data to be emitted. The clock of emitter 40 must be synchronized with XCO. Therefore, XCO should be as stable in phase and frequency as possible, whatever RC Ext may be.

Figure 4:
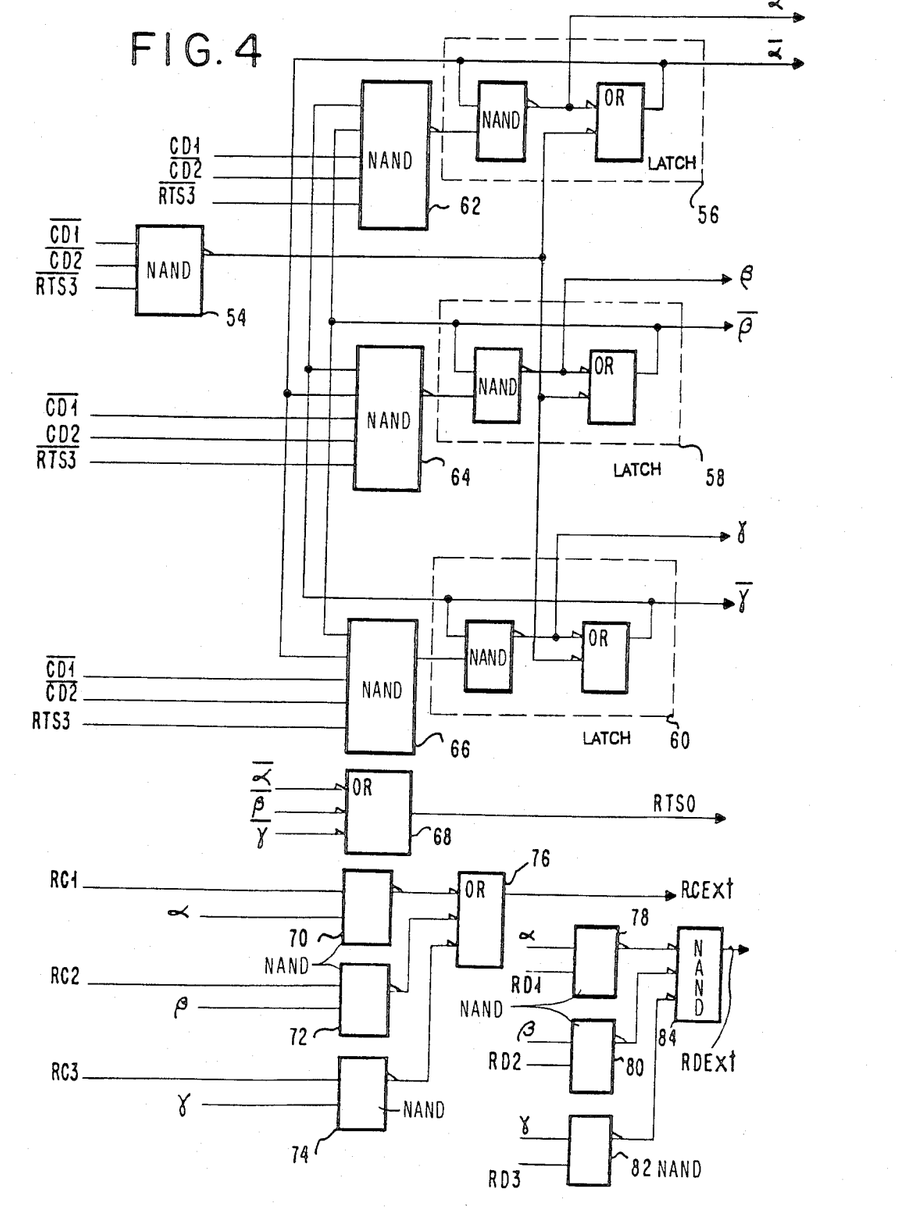
FIG. 4 shows circuit 50 of FIG. 4B.

FIG. 4 shows an embodiment of excluding circuit 50. Signal $\overline{CD1}$, $\overline{CD2}$ and $\overline{RTS3}$ (the bar above the signal reference indicates that the referenced signal is an inverse logic signal) of interface I1, I2 and I3 and applied to the input of a NAND logic circuit 52. The output of circuit 54 is used to trigger three latches 56, 58 and 60 respectively delivering signals $\alpha$, $\beta$, $\gamma$ and their complements (inverses) $\overline{\alpha}$, $\overline{\beta}$, $\overline{\gamma}$. The set inputs of latches 56, 58 and 60 are respectively connected to the outputs of NAND logic circuits 62, 64 and 66. The inputs of circuits 62 receive signals $\overline{\beta}$, $\overline{\gamma}$, CD1, CD2 and RTS3.

Circuit 64 receives $\overline{\alpha}$, $\overline{\gamma}$, CD2, $\overline{CD1}$ and $\overline{RTS3}$. And circuit 66 receives $\alpha$, $\beta$, $\overline{RTS3}$, $\overline{CD1}$ and $\overline{CD2}$. OR logic circuit 68 receives signals $\overline{\alpha}$, $\overline{\beta}$ and $\overline{\gamma}$ and provides information $RTSO = \alpha + \beta + \gamma$ which informs the emitter 38 of the request to send expressed by one of modems M3 or M4 or by terminal DTE1, to modem M2. External clock signals RC1, RC2, RC3 provided by interfaces I'1, I'2 and I'3 (through circuits XC1, XC2 and XC3 of interfaces I1, I2 and I3) are respectively applied to one of the inputs of a NAND circuit 70, 72 or 74. Another input of circuits 70, 72 and 74 also respectively receive signals $\alpha$, $\beta$ and $\gamma$. OR circuit 76 the input of which are connected to the outputs of circuits 70, 72 and 74, outputs so-called "external clock" information RC Ext issued from the one of terminals M3, M4 or DTE1 which has been chosen to be served by emitter 38 of modem M2. In fact, this chosen terminal is, at a given instant, the first terminal which provided a request to send and thus, has excluded all the other terminals. Data RD1, RD2 and RD3 provided by interface I'1, I'2 and I'3 (through circuits XD1, XD2 and XD3 of interfaces I1, I2 and I3) are respectively applied to the inputs of NAND circuits 78, 80 and 82. Another input of these NAND circuits respectively receives signals $\alpha$, $\beta$ and $\gamma$. The outputs of circuits 78, 80 and 82 are connected to the inputs of NAND circuit 84. The output of circuit 84 provides signals RD Ext representing the data to be emitted and provided by one of terminals M3, M4 or DTE1.

Clock signals RC Ext are the signals to be processed in order to apply a signal relatively stable and consistent in phase and frequency to oscillator PLO 40, this operation being to be carried out without any disturbance of the transmission of data RD Ext to be sent to emitter 38. The frequency adjustments are relatively simple. Signal RC Ext must be at the same frequency as clock 40 of emitter 38 of modem M2. Adequate crystal controlled clocks are conventionally used within the transmission network.

Figure 5:
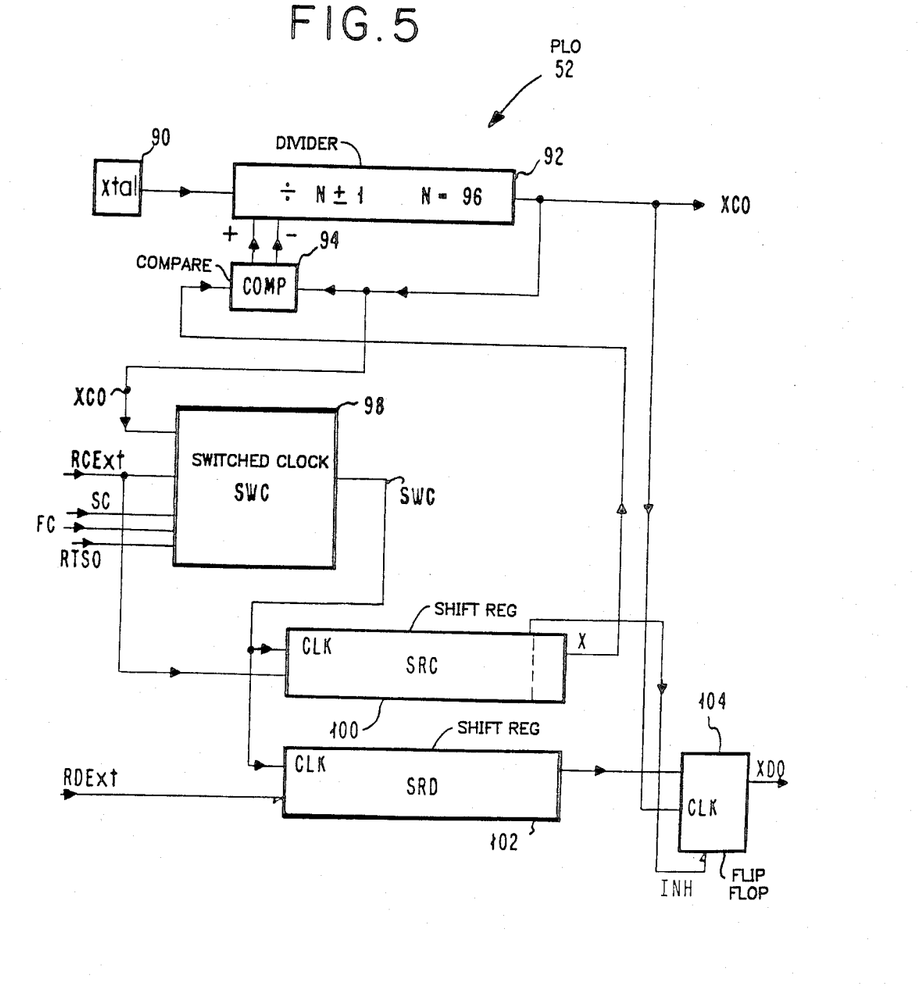
FIG. 5 is a block diagram of the buffering device 52 of FIG. 3B.

The phase adjustments which are the most critical, are carried out by using the device schematically shown in FIG. 5. This device is part of the clock and data buffering circuit 52. The circuit 52 comprises a conventional PLO clock, i.e., mainly including a crystal oscillator 90 connected to a frequency divider circuit 92. The output of divider 92 from which the recovered clock signal XCO is to be picked up, is connected to one of the inputs of a phase comparing circuit 94. Compare circuit 94 is provided with two outputs connected to the (+) and (−) inputs of divider 92. The purpose of circuit 90, 92, 94 is to track signal XCO.

The external clock signal RC Ext is applied to one of the inputs of switched clock generating circuit 98. Another input of circuit 98 is connected to receive the recovered clock information XCO. Three other signals, namely a fast clock signal (FC), a slow clock signal (SC) and a time reference signal (RTSO) provided through the excluding circuit 50, are also applied to the input of circuit 98. Circuit 98 provides a switched clock signal (SWC) which is used to control the shifting of shift registers 100 and 102. The first one of these shift registers which is labelled SCR, acts as a clock shift register. Its input is connected to receive the signal RC Ext and its output (X) is connected to the second input (also called "control" or "reference" input) of phase comparator 94. Therefore, signal X represents a shifted clock signal reference. The data input of the second shift register which is labelled SRD, is connected to receive data RD Ext provided by the terminal and to be transmitted by the modem M2. Said second register acts as a data shift register. The output of shift register SRD 102 drives a latch or gate 104 also controlled by the recovered clock signal XCO (and by a so-called "INH" inhibit signal provided by the next to last stage of register SRC). The PLO (90, 92, 94) includes a crystal oscillator 90 adjusted to a frequency equal to 96 Fb with Fb being the frequency of the emitter clock 40. The clock signal 96 Fb is divided in divide circuit 92 by a factor of $N \pm 1$, with $N = 3$. When comparator 94 applies a signal to the (+) input of divider 92, said divider 92 divides the frequency of the signal oscillating at 96 Fb, by a factor equal to 97. When the signal of comparator 94 is applied to the (−) input of divider 92, the frequency of the signal at 96 Fb is divided by 95. When neither of the comparator 94 outputs is energized, circuit 92 divided the frequency of the signal provided by crystal oscillator 90, by a factor equal to 96.

Figure 6:
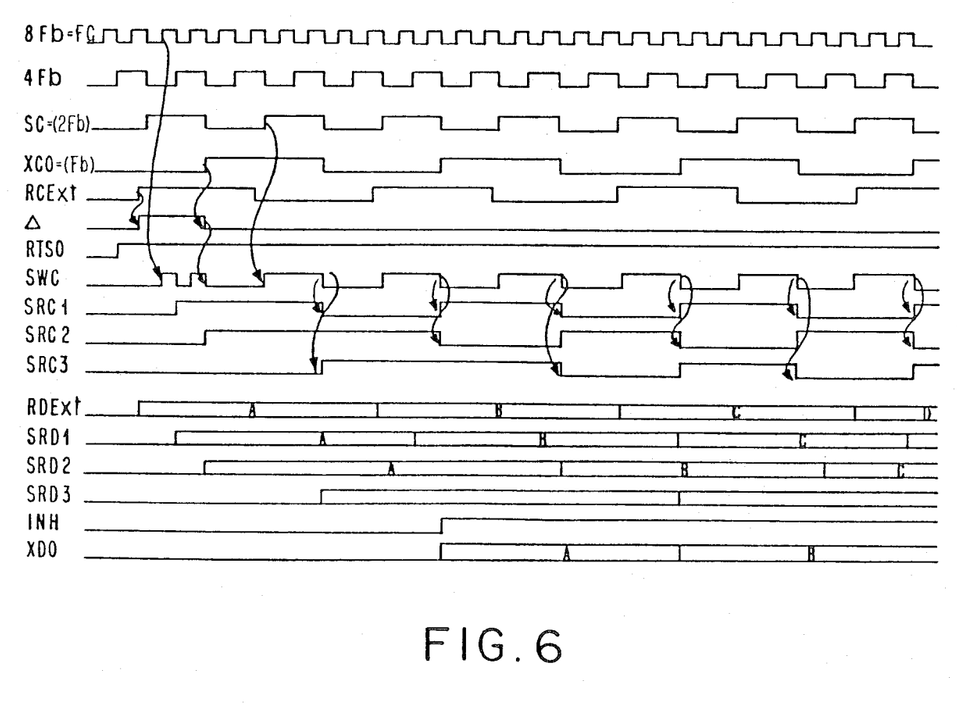
FIG. 6 is a time diagram of the operation of the device of the invention.

FIG. 6 is a time diagram of the operations performed by the device of FIG. 5. The first three lines represent the signals at frequencies 8Fb, 4Fb, 2Fb and Fb=XCO. These signals are derived from the signal at 96FB provided by crystal oscillator 90. The fifth line of the diagram represents external clock signal RC Ext. The sixth line represents a signal Δ indicating the phase delay between the first leading edge of RC Ext and the first leading edge of signal XCO shown on line 4 of the diagram. In the present case, the "first leading edge" means the first leading edge following the occurrence of a request to send, i.e., passage of RSTO from the low logic level to the high logic level (see the next line of the diagram).

Signal Δ is generated only when a leading edge of signal RSTO appears. When the signal Δ is high and starting with a leading edge of fast frequency clock signal FC=8Fb, the signal SWC (represented on the eighth line of the diagram) varies at same frequency FC. For the remaining time, i.e., when Δ is low, signal SWC varies at slow frequency SC. It should be noted that on the diagram of FIG. 6, FC=8Fb and SC=2Fb. These limits have been chosen only to simplify the time diagrams. In practice FC has been equal to 16Fb, said signal at 16Fb being itself obtained from a signal FC' at 32Fb.

The next three lines of the diagram are respectively referenced SRC1, SRC2 and SRC3. The signals illustrated on these lines show the evolution of the contents of shift register SRC for three successive shifts. This register is loaded with signal RC Ext and its contents is shifted under the control of the trailing edges of switched clock signal SWC.

Line 12 shows data bits A, B, C, etc., which are applied to the input of register SRD. These data bits are applied to the input of register SRD in phase with external clock signal RC Ext. The phase of the same data bits is originally independent of the phase of recovered clock signal XCO. But, as shown by the signals on the diagram lines referenced SRD1, SRD2 and SRD3, the data, i.e., the level values, at the input of register SRD at switched clock instants SWC, are shifted by this switched clock signal. The shifts are performed on the leading edges of signal SWC. In practice, registers SRC and SRD have been chosen with sixteen stages and not three. As shown by the signal of diagram line SRD3, bit A the phase of which is to be adjusted, is extended with respect to bits B, C, D, etc. Then, the so-called "gate inhibit" signal referenced INH, is used for appropriately truncating bit A to the same length as the others to cause it to appear in phase with the recovered clock signal. This is shown by diagram line XDO representing the in-phase data to be submitted to emitter 38. Therefore, SDO represents the data bit train to be submitted to emitter 38.

A more particular embodiment of the various elements comprising the clock and data buffering device shown on FIG. 5 will be described in the following.

Figure 7:
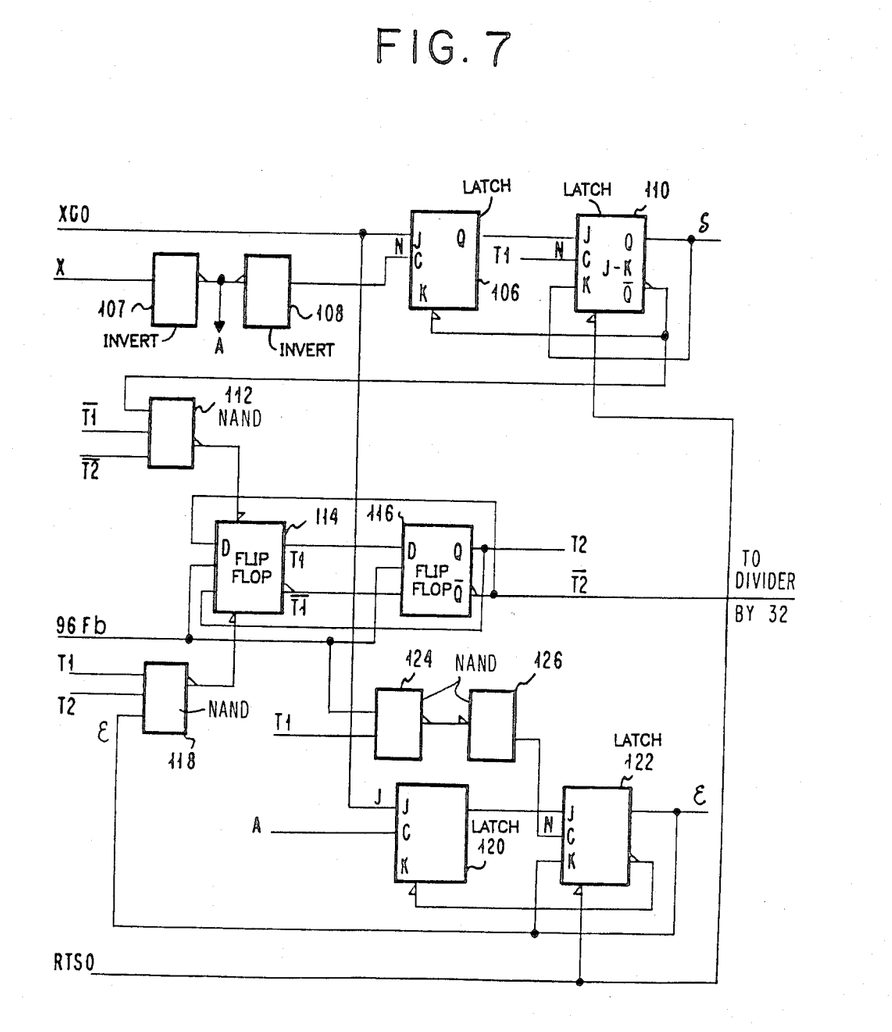
FIGS. 7 and 8 represent a block diagram of the phase locked clock device of FIG. 5.

FIG. 7 illustrates the control elements of the feedback loop of the PLO provided in the buffer device shown on FIG. 5. More particularly, it is a description of the circuits belonging to devices 92 and 94 in which the frequency of the signal at 96Fb provided by crystal oscillator 90 is divided by $N' = 3$, $N' - 1 = 2$ or $N' + 1 = 4$. The adjustment to the frequency $(96 \pm 1)$ Fb is ensured through the use of a second divider (not shown) included in circuit 92 and mounted in series with the circuit of FIG. 7. The recovered clock signal XCO provided by divider 92 is applied to input J of a latch 106 of the J-K type. The reference signal X appearing at the output of shift register SRC is applied to the input of a first invert circuit 107 followed by a second invert circuit 108. The output of invert circuit 108 is applied to input C of J-K latch 106. It should be noted that the wire leading to input C of J-K latch 106 is referenced N. This means that said J-K latch reads the level of the signal applied to input J when the signal applied to input C is on a negative going edge (negative slope). The substitution of P for N would thus mean that the positive slope of the signal applied to input C, is taken into consideration. The normal output of latch 106 is applied to input J of another J-K latch 110. The normal output of latch 110 is fed back to input K of the same latch. The normal output signal of latch 110 is referenced δ. Input C of latch 110 receives signal T1 which will be described later. Latch 106 is latched by the application of inverse output ($\overline{Q}$) of latch 110 thereto until a new negative going edge of signal XCO appears. Same output $\overline{Q}$ of latch 110 is applied to one of the inputs of a NAND logic circuit 112 provided with two other inputs receiving signals $\overline{T1}$ and $\overline{T2}$ (to be described later).

The signal at 96Fb provided by crystal oscillator 90, is applied to the inputs of two flip-flop 114 and 116 mounted in cascade. The normal output of flip-flop 114 provides signal T1. The outputs of latch 114 are connected to the inputs of latch 116 which provides signal T1, the inverse of which ($\overline{T2}$) is applied to frequency dividing circuit 94. The outputs of latch 116 are applied to the input of latch 114. The output of NAND circuit 112 controls flip flop 114.

Signals T1 and T2 are applied to the inputs of NAND circuit 118 a third input of which receives signal ε. The output of NAND circuit 118 controls latch 114.

Signal A taken from the output of invert circuit 107, is applied to input C of J-K latch 120 in FIG. 7. Input J of latch 120 receives the recovered clock signal XCO. The normal output of latch 120 is connected to the input of J-K latch 122. The normal output of latch 122 provides signal ε which is applied to its own input K. The inverted output of latch 122 controls the latching of J-K latch 120.

A signal at 96Fb provided by crystal oscillator 90 is applied to one of the inputs of NAND circuit 124 which is provided with a second input receiving signal T1. The output of NAND circuit 124 is inverted in 126 and the applied to input C of J-K latch 122.

Signal RTSO is used to latch J-K latches 110 and 122.

The circuit comprising elements 106, 107, 108 and 110 can be considered as used to define and indicate the lagging delay separating recovered clock signal XCO and reference signal X. The circuit comprising 120, 124 and 226 defines and indicates the leading delay between clock XCO and reference signal X.

Circuits 112, 114, 116 and 118 divided the signal at 96Fb provided by crystal oscillator 90, by 2, 3 or 4. Three states are defined, namely: a stationary state, a delayed state and an advanced state. In the stationary state obtained when $\overline{\delta}=1$ and $\epsilon=0$ or $\overline{\delta}=0$ and $\epsilon=1$, the dividing factor obtained is 3. The delay state corresponding to $\delta=\epsilon=0$ involves a division by 4. And the advance state corresponding to $\overline{\delta}=\epsilon=1$ involves a division by 2.

Figure 8:
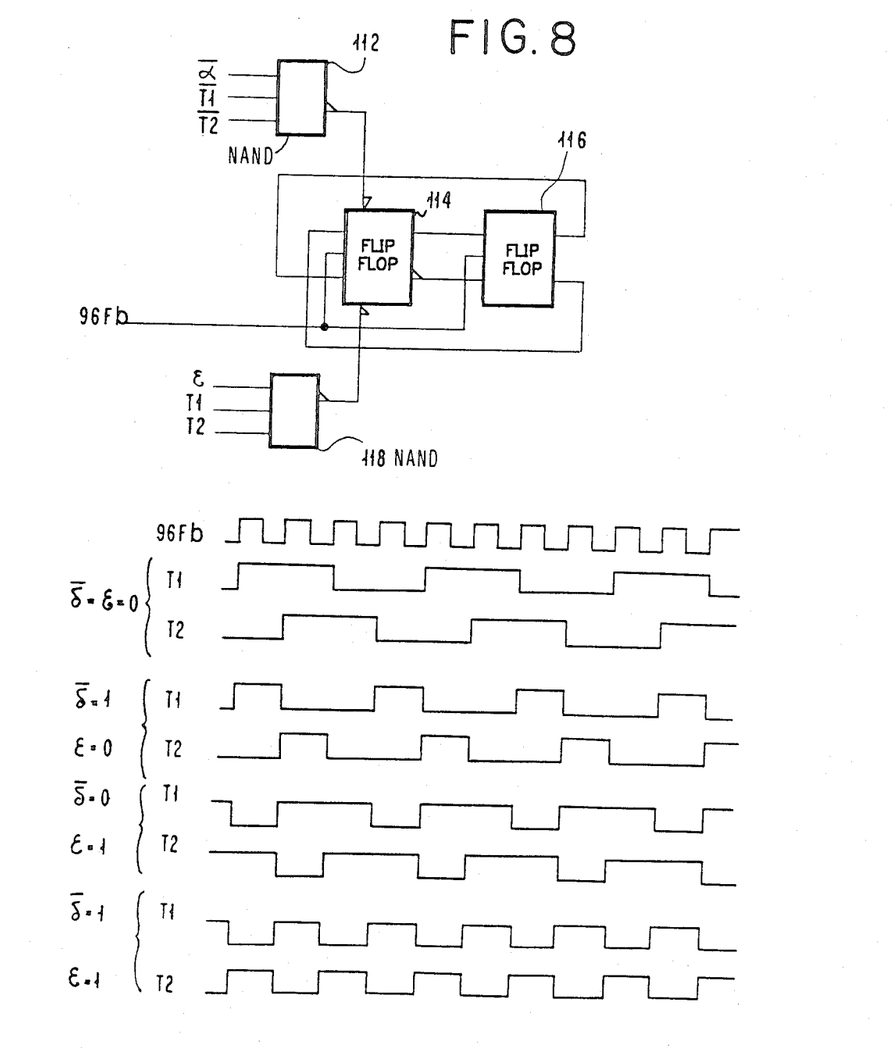

FIG. 8 shows an illustration of the device carrying out the frequency divisions as well as the diagrams of the signals T1 and T2. The operation consisting in switching from a dividing factor of 3 to a factor of 2 or 4 is performed only once per period 1/Fb. The dividing factor is brought back to "3" as soon as output $\overline{Q}$ of latch 110 goes to logic level one.

Output $\overline{T2}$ of latch 116 drives a dividing circuit (not shown) dividing frequencies by a factor of 32. Therefore, the set of operations performed by circuits 92 and 94 consist in adding or subtracting "1" to or from factor N once per period 1/Fb until the shifted clock signal X becomes in phase with XCO.

Figure 9:
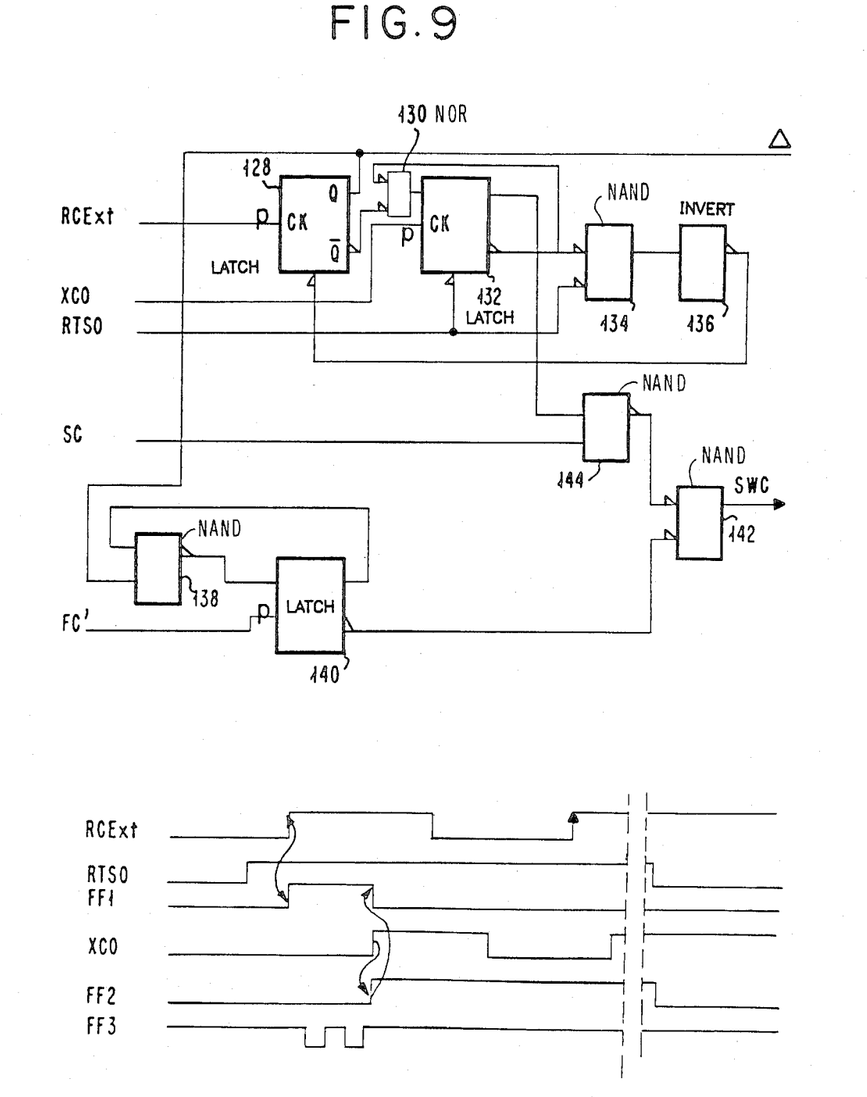
FIG. 9 is a block diagram of device 98 of FIG. 5.

FIG. 9 illustrates a particular embodiment of the switched clock generating circuit 98 providing the switched clock signal SWC. This figure also shows a diagram of the signals involved during the operation of circuit 98.

The external clock signal is applied to the input of a latch 128 whose inverted output ($\overline{Q}$) is applied to the input of a NOR circuit 130. The output of circuit 130 is applied to the input of a latch 132. The recovered clock signal XCO is also applied to circuit 132. The inverted output of latch 132 is fed back to the input of circuit 130 and to one of the inputs of a NAND circuit 134. A second input of circuit 134 receives signal RTSO from excluding circuit 50. Signal RTSO is also applied to latch 132. The output of circuit 134 receives signal RTSO from excluding circuit 50. Signal RTSO is also applied to latch 132. The output of circuit 134 is inverted through 136 and applied to latch 128. Assembly 128 to 136 acts as a circuit comparing the phases of XCO and RC Ext.

The normal output of latch 128 is supplied to the input of a NAND circuit 138. The output of circuit 138 is applied to the input of a latch 140 controlled by signal FC' at 32Fb. The normal output of latch 140 is applied to the input of NAND circuit 138. Inverted output (Q) of latch 140 delivers a signal at 16Fb which is applied to one of the inputs of a NAND circuit 142 a second input of which is connected to the output of a NAND circuit 144. The inputs of NAND circuit 144 receive SC at 2Fb and the signal issued from normal output (Q) of latch 132. Switched clock signal SWC is obtained at the output of circuit 142. Therefore, assembly 142-144 acts as a gate.

The lower portion of FIG. 9 illustrates the diagram of the signals obtained through the use of the circuits shown in the upper portion of said FIG. 9. The first line represents signal RC Ext. The second line represents FF1, XCO, FF2 and FF3. Signals FF1, FF2 and FF3 are respectively delivered by latches 128, 132 and 140.

The appearance of a leading edge on RC Ext causes latch FF1 to be triggered and normal output (Q) thereof goes to the high level. When signal XCO goes high, RTSO being high, latch FF2 goes high. The level of the output of inverter 136 goes low and causes FF1 to go back to the low level. Therefore, the signal obtained at normal output (Q) of latch 128 comprises a pulse the duration of which corresponds to the phase delay between external clock signal RC Ext and recovered clock signal XCO. (Therefore, latch 128 measures the phase delay referenced $\Delta$ on FIG. 6. When $\Delta$ is high, gate 138 is open. On each positive going edge of signal FC', latch 220 reads the logic level applied to its input D and reproduces this level at normal output (Q). The gate 138 and latch 140 assembly consists, therefore, in a frequency divider by two, operating only during interval $\Delta=1$. Then, signal FF3=FC is obtained at 16Fb on inverted output ($\overline{Q}$) of latch 140.

Normal output (Q) of latch 132 controls the opening of a gate 144 the input of which receives signal SC at 2Fb. Inverted signal SC is transmitted as an output from gate 144. A circuit 142 ensuring a NAND function on the signals issued from circuits 140 and 144, outputs signal SWC, i.e., a signal oscillating either at FC=16Fb (fast clock) or at SC=2Fb (slow clock).

Signal RTSO controls the locking of latch 132. To cause circuit 128, 130, 132 to restart an operating cycle, RTSO must go through a positive going edge. This means that the excluding circuit must stop serving the currently served terminal and then, be switched to the first terminal raising RTS.

Figure 10:
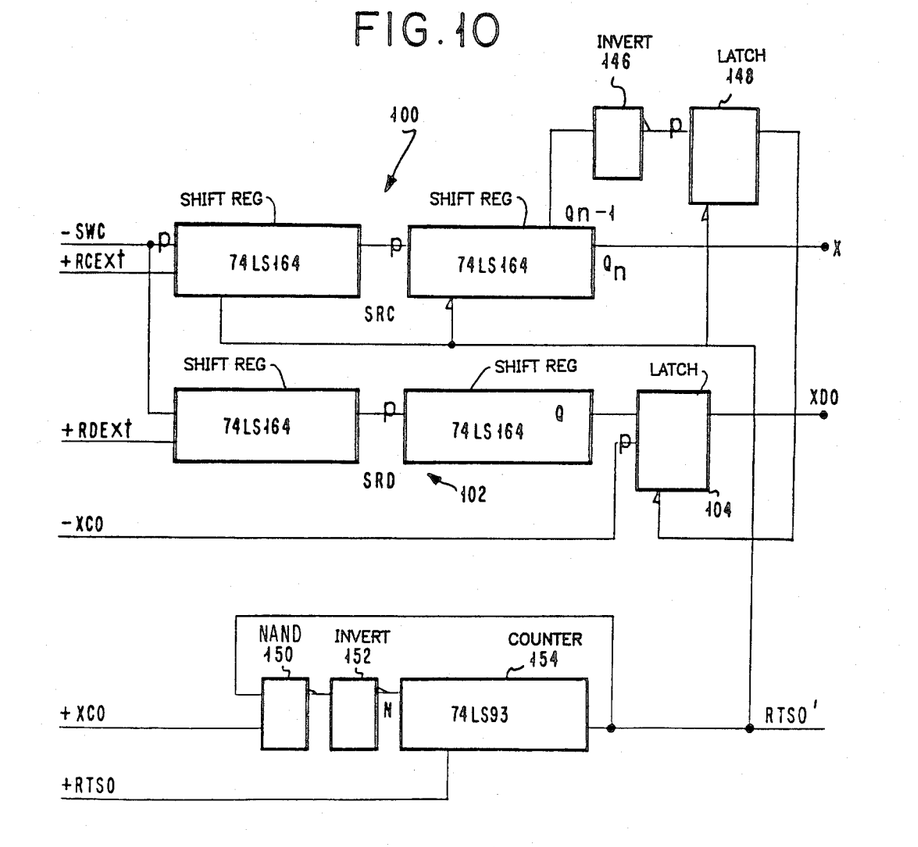
FIG. 10 is a block diagram of clocks 100 and 102 of FIG. 5.

FIG. 10 shows an embodiment of the portion of the data and clock buffering circuit shown in FIG. 5, which mainly includes the two shift registers SRC and SRD and latch 104 acting as a gate. On FIG. 10, each shift register SRC and SRD is represented by two registers mounted in series. This is only due to the fact that 8-bit modules (Texas Instrument and referenced 74LS164), have been used. As also indicated about FIG. 5, the inputs of registers SRC and SRD respectively receive signals RC Ext and RD Ext. These signals are sampled at the rate of appearance of the positive going edge of signal SWC.

Output Qn of register SRC delivers the shifted clock reference signal X provided for phase comparator 94. The output of register SRD goes through gate 104 the opening of which is controlled by the positive-going edges of signal XCO. In addition, the output of penultimate stage Qn−1 of shift register SRC goes through inverter 146, then through latch 148 and provides the "inhibit" information INH which inhibits the opening of gate 104 so as to truncate to the appropriate length, the first data bit introduced into register SRD after the passage of RTSO from the "0" level to the "1" level. In other words, the first bit introduced into register SRD during the adjustment period of clock XCO is truncated, as required, to the same length as the bits which are normally received.

In addition, signal XCO goes through a circuit applying a delay of 16 bit-times to signal RTSO. This circuit includes a NAND circuit 150 in series with an inverter 152 and a binary counter 154. The output of binary counter 154 (referenced RTSO') is used to unload registers SRC and SRD after the return of signal RTSO to the low level.

As it could be noted from the above description in the system of the invention, it does not make any difference what the exact origin of external clock signal XCO may be. Whether said signal is issued from a modem (M3, M4) or from a terminal (DTE1), has no importance for the invention. Therefore, in all cases the element providing the external clock signal can be considered as a terminal.

What is claimed is:

1. An interface device for synchronizing together an internally clocked modem and at least one data terminal equipment (DTE) each of said DTE being provided with a clock circuit for generating an external clock signal RC Ext, said interface including:
   a phase locked oscillator (PLO) provided with a control input and generating a recovered clock signal (XCO) to be used for adjusting said modem clock;
   a switched clock generating circuit connected to said PLO and provided with one of said RC Ext signals for deriving a switched clock signal representative of the phase delay between said recovered clock signal and said one RC Ext signal;
   a first shift register provided with said one RC Ext signal and controlled by said switched clock signal for providing a shifted reference signal, said reference signal being applied to said PLO control input;
   a second shift register connected to said at least one DTE for receiving data therefrom, and controlled by said switched clock signal for shifting said data; and
   a gate connected to said second shift register and controlled by said recovered clock signal for providing in phase data to said modem.

2. An interface device according to claim 1 wherein said switched clock generator includes:
   first generating means for generating a fast clock signal;
   second generating means for generating a slow clock signal;
   comparing the phases of said recovered clock signal and said external clock signal to derive phase delay information therefrom;
   first gating means connected to said first generating means and to said comparing means for gating said fast clock signal at the output of said switched clock generator during said phase delay and following the occurrence of a modem request to send;
   second gating means connected to said second generating means and to said first gating means for gating said slow clock signal at the output of said switched clock generator subsequently to said gating of said fast clock signal.

3. An interface citcuit according to claim 1 or 2 wherein said first shift register is provided with an inhibit output connected to said gate.

4. An interface circuit according to claim 1 or 2 wherein said PLO includes:
   a crystal oscillator;
   a frequency divider circuit the input of which is connected to said crystal oscillator and the output of which is made to provide said recovered clock signal, said divider being initially set to divide by a given factor;
   a phase comparing circuit for comparing said recovered clock signal with said reference signal, and for deriving therefrom information for adding or subtracting one unit to N.

5. An interface circuit according to claim 3 wherein said PLO includes:
   a crystal oscillator;
   a frequency divider circuit the input of which is connected to said crystal oscillator and the output of which is made to provide said recovered clock signal, said divider being initially set to divide by a given factor;
   a phase comparing circuit for comparing said recovered clock signal with said reference signal, and for deriving therefrom information for adding or subtracting one unit to N.

* * * * *